(12) United States Patent
Bottom

(10) Patent No.: US 6,950,895 B2
(45) Date of Patent: Sep. 27, 2005

(54) MODULAR SERVER ARCHITECTURE

(75) Inventor: David A. Bottom, Arroyo Grande, CA (US)

(73) Assignee: Intel Corporation, Santa Clara, CA (US)

(*) Notice: Subject to any disclaimer, the term of this patent is extended or adjusted under 35 U.S.C. 154(b) by 538 days.

(21) Appl. No.: 09/880,403

(22) Filed: Jun. 13, 2001

(65) Prior Publication Data

US 2002/0194412 A1 Dec. 19, 2002

(51) Int. Cl.[7] .......................... G06F 13/00; H05K 7/14
(52) U.S. Cl. ........................ 710/301; 361/796
(58) Field of Search .......................... 710/301, 302; 312/223.2, 223.3; 361/608, 683, 686, 687, 724, 727, 730, 752, 753, 788, 796, 797, 803

(56) References Cited

U.S. PATENT DOCUMENTS

| | | | | |
|---|---|---|---|---|
| 5,488,541 A | * | 1/1996 | Mistry et al. | 361/788 |
| 6,025,989 A | * | 2/2000 | Ayd et al. | 361/695 |
| 6,035,356 A | * | 3/2000 | Khan et al. | 710/301 |
| 6,411,506 B1 | * | 6/2002 | Hipp et al. | 361/686 |
| 6,452,809 B1 | * | 9/2002 | Jackson et al. | 361/796 |

\* cited by examiner

*Primary Examiner*—Khanh Dang
(74) *Attorney, Agent, or Firm*—Ted A. Crawford

(57) ABSTRACT

A modular server system includes a midplane having a system management bus and a plurality of blade interfaces on the midplane. The blade interfaces are in electrical communication with each other. A server blade is removeably connectable to one of the plurality of blade interfaces on the midplane. The server blade has a server blade system management bus in electrical communication with the system management bus of the midplane, and a network interface to connect to a network. A media blade is removeably connectable to one of the plurality of blade interfaces on the midplane, and the media blade has at least one storage medium device.

35 Claims, 6 Drawing Sheets

MODULAR SERVER ARCHITECTURE

RELATED U.S. APPLICATION DATA

This application claims priority under 35 U.S.C. Section 119(e) from U.S. provisional patent application Ser. No. 60/287,466, filed Apr. 30, 2001.

BACKGROUND OF THE INVENTION

1. Field of the Invention

The present invention generally relates to computer server systems. More particularly, the present invention relates to computer server systems having a modular architecture.

2. Discussion of the Related Art

Consumers today embrace an expanding array of Internet applications, and businesses are jumping on the e-commerce bandwagon to take advantage of this growth. Internet Protocol (IP) services are the key to the phenomenal growth in Web hosting. Hosting, in turn, drives utilization of bandwidth supplied by the backbone network. For those who own backbone networks, the focus is about selling bandwidth—the amount of data that can be transmitted in a fixed amount of time. The builders of this infrastructure today control the growth of the Internet. At the heart of the infrastructure are servers, which are the engines that drive IP services.

Those who have built and operate data centers that interface to the Internet backbone network strive to provide a secure, managed, and reliable environment in which to host IP services, which they sell along with Internet bandwidth, so as to optimize profitability. But, backbone network providers have also become data center operators because they have seen that data centers sell more IP services and therefore generate even more revenue from sales of their network bandwidth.

Next generation Application Service Providers (ASPs) are writing applications to provide even more IP services. To date, e-mail is the number one selling ASP package. The growth in wireless Internet and other innovations will further expand these services. In the case of the ASP, its IP service is the revenue generator. A data center hosts the ASP's IP service, and somewhere, a backbone network provider is selling bandwidth to the data center operator.

Revenue generation is dependent on the Internet data center and its entire infrastructure. Building and operating an Internet data center is very costly. Data centers constructed today to house as many as 10,000 servers cost upwards of $150 million to build and outfit. These facilities have been proclaimed the most expensive real estate on the planet. Added to that are the operational resources required to keep a 24 hours, 7 days a week, 365 days a year data center running smoothly. Therefore, if the servers in the data centers are the engines powering IP services, it becomes very clear that every data center requires a few thousand really good, "bulletproof" engines to enhance revenue generation and help control infrastructure costs.

The servers installed in Internet data centers typically utilize more physical space and more power than they actually require to perform their tasks. These server systems are often constructed with less than optimal quality components. Many server systems have poor reliability relative to the large number of units installed, which may range from the hundreds to the thousands, and as a result have high maintenance and operational costs. With today's skyrocketing real estate costs, it is an important consideration for data centers to efficiently use the floor space available for the server systems. Moreover, server systems are generally very cumbersome and time consuming to deploy and repair, and the costs associated with the time it takes to deploy or repair a server also makes a significant impact on the bottom line for a data center operator.

Therefore, there is a need for a compact, high-density, rapidly-deployable, high-availability server system having simplified management and serviceability, and unlimited scalability. The server system would provide higher revenues for data center operators, top-of-the-line performance, and cost savings.

DETAILED DESCRIPTION

Figure 1:
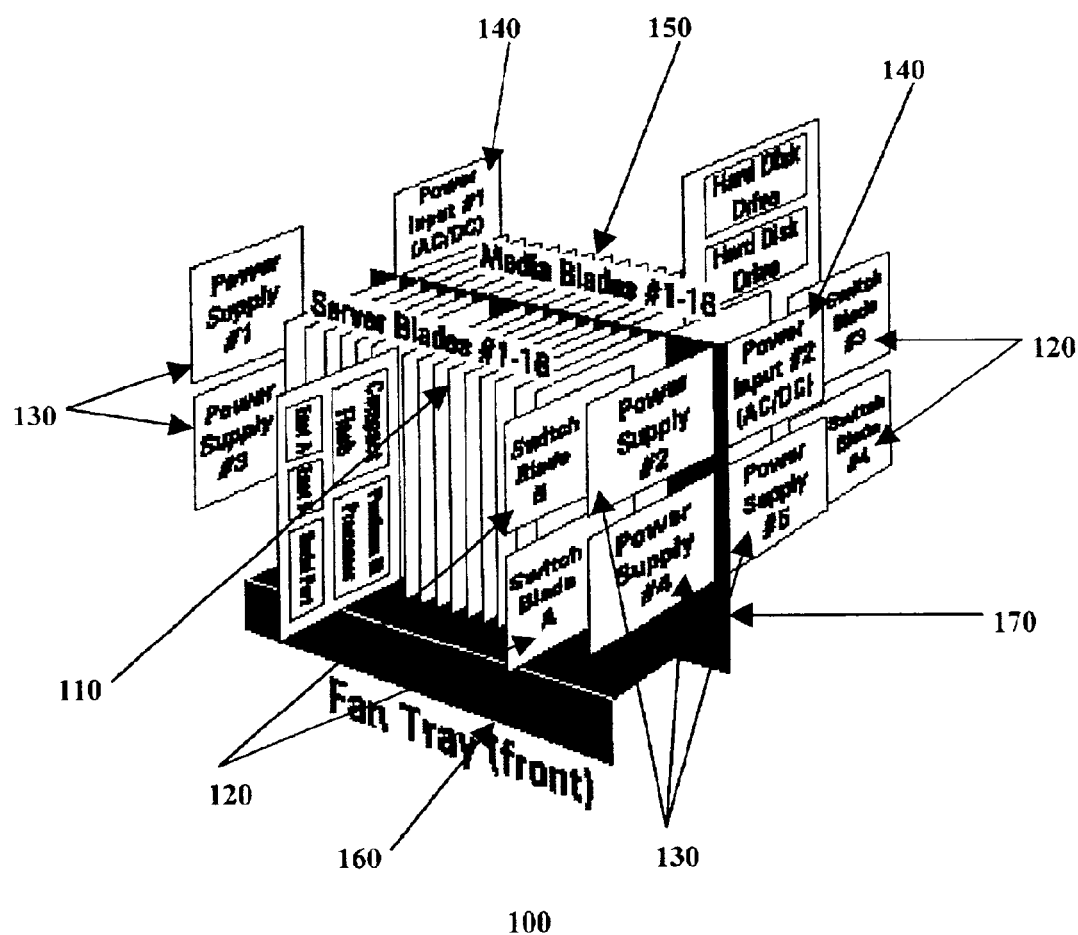
FIG. 1 illustrates a modular server system according to an embodiment of the present invention.

FIG. 1 illustrates a modular server system according to an embodiment of the present invention. The modular server system 100 is provided for Web hosting and ASPs requiring server solutions with carrier-class availability, reliability, and scalability. Carrier-class systems have features that are more demanding than enterprise-grade systems, such as "high availability" (HA), high dependability and redundancy. Carrier-class systems are typically used in business-critical applications including telecommunications and data communications where system up-time is crucial. In the telecommunications industry, high availability servers are redundant servers that achieve 99.999% up-time, often referred to as "five nines".

At the heart of the modular server system 100 is the midplane 170, which may be a PC-style circuit board having a plurality of blade interfaces 420 (see FIG. 4) providing a common interconnect for all modules connected thereto. The blade interfaces 420 are in electrical communication with each other and with the system management bus (discussed below) of the midplane 170. The midplane 170 is preferably based on a CompactPCI form factor (CompactPCI Specification, PICMG 2.0, Version 2.1, by the PCI (Peripheral Component Interconnect) Industrial Computer Manufactures Group (PICMG)), wherein the blade interfaces 420 are CompactPCI slots or connectors. CompactPCI utilizes the Eurocard form factor popularized by the "Versa Module Europa" (VME) bus having standard Eurocard dimensions and high-density 2 mm pin-and-socket connectors. In the modular server system 100 illustrated in FIG. 1, up to sixteen independent server blades 110 may be supported, along with up to sixteen media blades 150. However, any other numbers of server blades 110 and media blades 150 may be supported. A blade is generally a mother board or a single board computer (SBC) having a central processing unit (CPU). Although it is preferable that each server blade 110 have a corresponding media blade 120, it is not a requirement, as multiple server blades 110 may share a single media blade 120, and vice versa. By utilizing the midplane 170, the network (such as the local area network) becomes the primary interconnect between the blades 110, 150. Server blades 110 and media blades 150 are discussed in further detail below.

The modular server system 100 illustrated in FIG. 1 is also adapted to support up to four switch blades 120 for complete system network (e.g., Ethernet) switching and N+1 redundancy. In an embodiment of the present invention, the switch blades 120 have twenty 10/100 Base-T auto-negotiating ports and support 4,096 Media Access Controller (MAC) addresses. Preferably, of the twenty ports, sixteen of them are assigned to one Ethernet channel from the system's 100 midplane 170 (connected to all sixteen server blades 110, as illustrated in the example in FIG. 1), and the remaining four ports are accessible through RJ-45 (Ethernet) connectors, for example, on the switch blade's 120 face plate. However, other configurations may be adapted depending on the number of server blades 110 supported by the modular server system 100. Data packets are preferably buffered in the switch blade 120 so that Ethernet collisions do not occur on any channel, and a full-managed Layer 3/4 switch may provide Quality of Service (QoS) control, while in all cases a non-block switch fabric with sufficient bandwidth to prevent packet loss is recommended.

According to an embodiment of the present invention, two switch blades 120 are utilized for a fully-functional modular server system 100, and additional switch blades 120 may be added for high availability redundancy. In a system 100 with four switch blades 120, for example, one can be assigned to Ethernet channel A for system management traffic, and another to channel B for Web traffic, while the remaining two may be placed in standby mode for hardware and/or software fail-over capability.

In the modular server system 100 illustrated in FIG. 1, up to six load sharing power supplies 130 (Power Supply #5 not shown in FIG. 1) may be connected to the midplane 170 to provide power to the modules of the server system 100. These power supplies 130 (e.g., 150 W power supplies) may provide for N+1 redundancy as well. Up to two power (AC/DC) inputs 140 may be connected to the midplane 170 to provide input power to the modular server system 100. A removable fan tray with cooling fans 160 (see also FIG. 2) may be utilized to provide cooling air flow within the modular server system 100 to cool the modules therein. According to an embodiment of the present invention, the removable fan tray 160 may include up to six fans for N+1 redundancy. The power supplies 130 and the cooling fans 160 of the modular server system 100 may be shared by the server blades 110 and media blades 150 within the modular server system 100 (i.e., each server blade 110 or media blade 150 need not have its own power supply or cooling fan). The sharing of the power supplies 130 and cooling fans 160 provides a more efficient use of the resources of the modular server system 100 and minimizes space.

Figure 2:
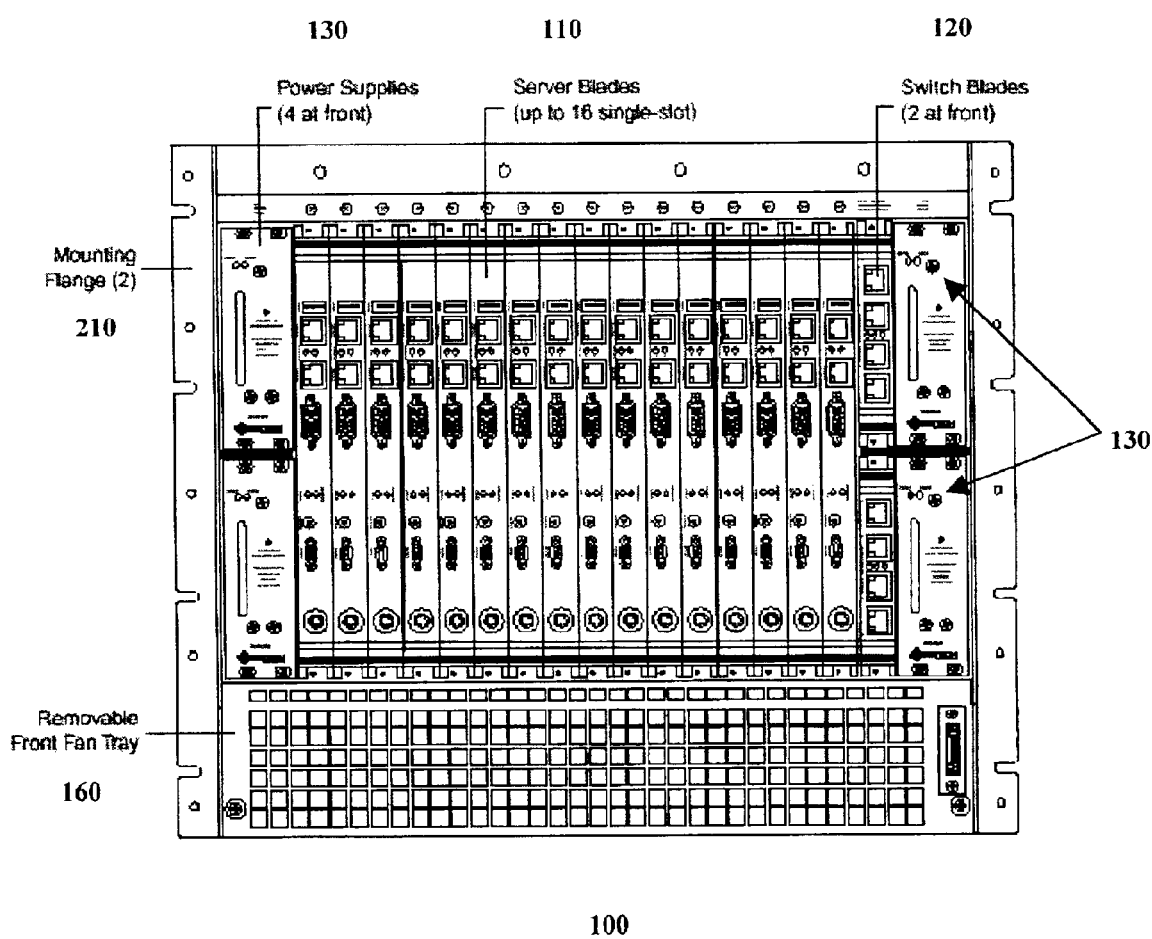
FIG. 2 illustrates a first side view of a modular server system according to an embodiment of the present invention.

FIG. 2 illustrates a first side view of a modular server system according to an embodiment of the present invention. According to an embodiment of the present invention, up to sixteen server blades 110 may be accommodated by the modular server system 100 at its first side. Two switch blades 120, such as 20-port Ethernet switches, may be accommodated on the first side of the modular server system 100. Up to four power supplies 130 may be accommodated on the first side of the modular server system 100 as well. The removable fan tray 160 may also be installed and removed from the first side of the modular server system 100. Mounting flanges 210 on the modular server system 100 allow for front, mid, or rear rack mounting.

Figure 3:
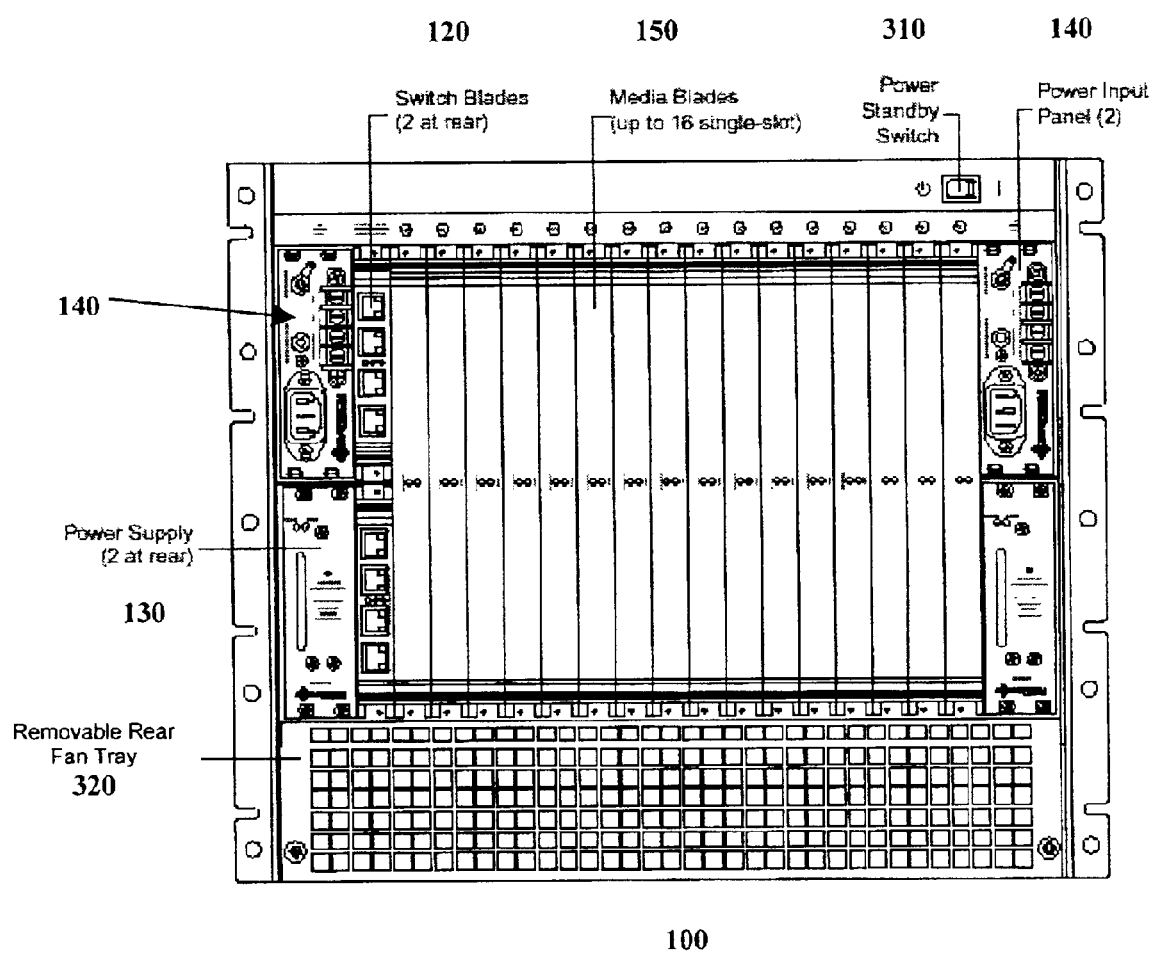
FIG. 3 illustrates a second side view of a modular server system according to an embodiment of the present invention.

FIG. 3 illustrates a second side view of a modular server system according to an embodiment of the present invention. According to an embodiment of the present invention, up to sixteen media blades 150 may be accommodated by the modular server system 100 at its second side. Two switch blades 120 may be also accommodated on the second side of the modular server system 100. Up to two power supplies 130 and two power inputs 140 may be accommodated on the second side of the modular server system 100 as well. A power switch 310 for the modular server system 400 may also be provided on the second side. A rear removable fan tray 320 may also be installed and removed from the second side of the modular server system 100. Although the server blades 110 and media blades 150 are preferably connected to the midplane 170 at opposite sides, that is not a requirement. The midplane 170 may be configured so that the server blades 110 and media blades 150 are connectable to the midplane 170 on the same side.

Figure 4:
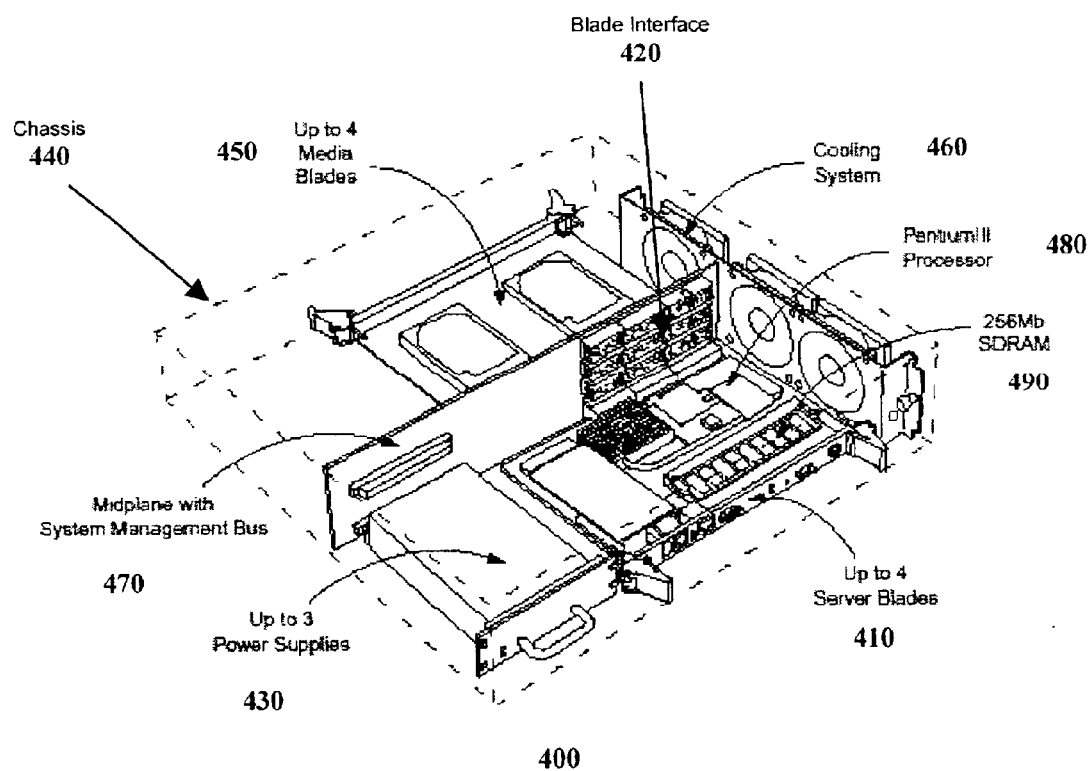
FIG. 4 illustrates a perspective view of a modular server system according to another embodiment of the present invention.

FIG. 4 illustrates a perspective view of a modular server system according to another embodiment of the present invention. The modular server system 400 in FIG. 4 is adapted to accommodate up to four server blades 410, and up to four media blades 450. A chassis 440 may be provided to enclose the modular server system 400. The midplane 470 provides a common interconnect for all modules connected thereto, including the server blades 410 and media blades 450. According to the embodiment in FIG. 4, up to three power supplies 430 may be accommodated by the modular server system 400. A cooling fan system 460 is also provided to provide cooling air flow to the modules of the server system 400. According to an embodiment of the present invention, the server blade 410 connected to the midplane 470 may include a 500 MHz Intel Pentium III processor 480, 256 KB on-die L2 cache, and a 256 MB error correcting coded (ECC) synchronous-dynamic random access memory (SDRAM) 490. However, any suitable central processing unit (CPU) and memory devices may be utilized. When the server blades 410 and media blades 450 are installed and configured in the modular server system 400, they operate like any other server system, utilizing available operating systems such as Microsoft Windows NT Server 4.0 (Service Pack 6a).

Figure 5:
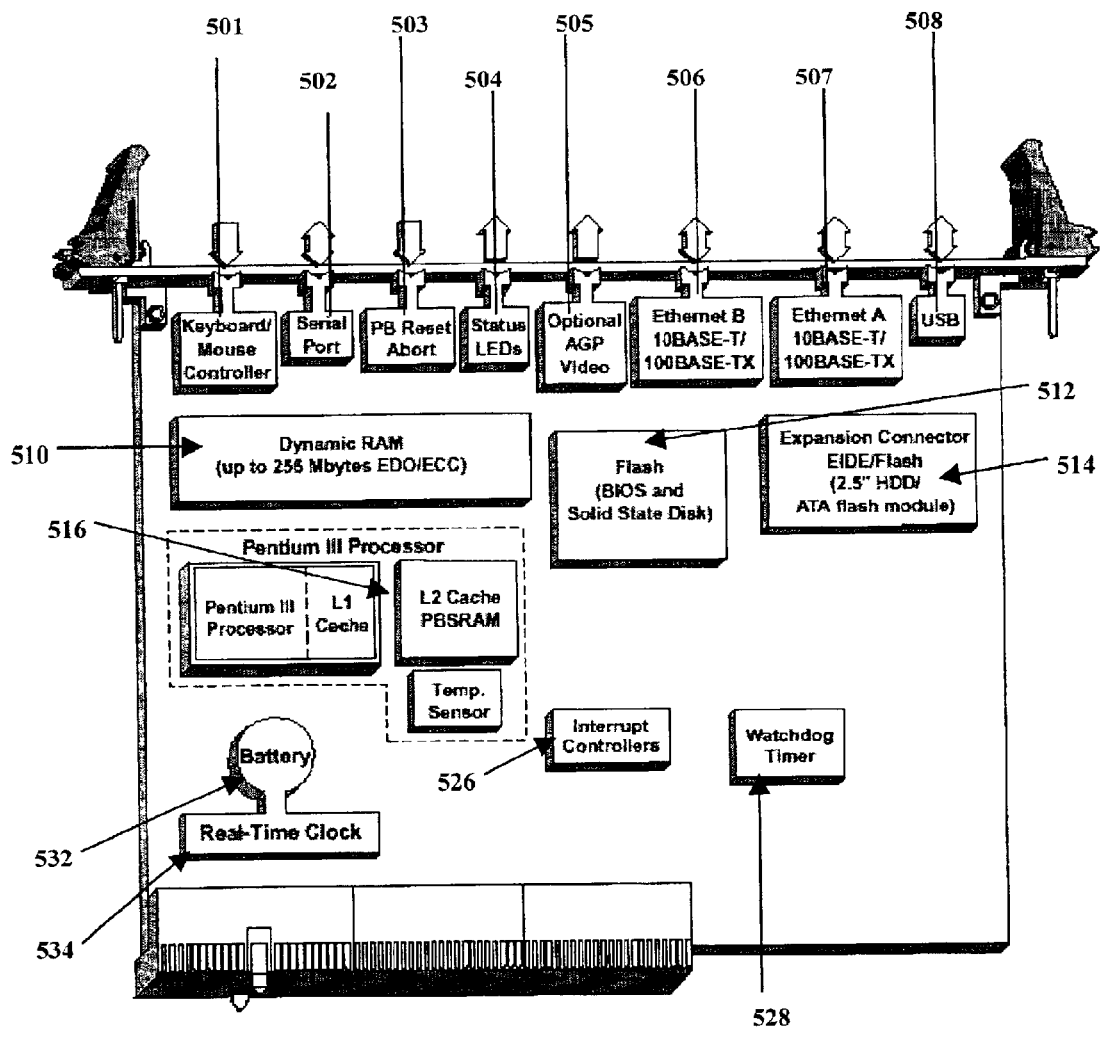
FIG. 5 illustrates a server blade according to an embodiment of the present invention.

FIG. 5 illustrates a server blade according to an embodiment of the present invention. The server blade 500 is preferably a telecom-style CPU board designed to work as a modular component of the server system 100 (see FIG. 1). When the server blade 500 is paired up with a media blade 150, the combination becomes an independent server within the modular server system 100, and therefore the modular server system 100 itself may house a plurality of independent servers. According to an embodiment of the present invention, the server blade 500 is designed according to the CompactPCI form factor. The Compact PCI form factor is an industry standard that provides a rugged, modular, high performance platform for the server blade 500. However, any suitable interface standard may be utilized, though. The CompactPCI form factor also enables "hot swap" functionality in a multi-server environment of the modular server system 100, meaning that the server blade 500 may be replaceable (removed from or installed into the modular server system 100) without powering down the entire system (CompactPCI Hot Swap Specification, PICMG 2.1, Version 1.0, by the PCI (Peripheral Component Interconnect) Industrial Computer Manufactures Group (PICMG)). Hot swapping allows a faster mean time to repair (MTTR) for damaged components or modules, such as field replaceable units (like server blades 110, media blades 150, power supplies 130, and the fan tray 160), within the modular server system 100.

The server blade 500 illustratively includes a CPU 516, such as the Intel Pentium III processor mobile module. The Pentium III processor module contains a power supply for the processor's unique voltage requirements, a temperature sensor, a system memory (L2 cache), and core logic required to bridge the processor to the standard system buses. In an embodiment of the present invention, the server blade 500 incorporates a system management bus, in communication with the system management bus of the midplane, for access to system-wide monitoring and alarming functions. The system management bus allows the server blade 500 (e.g., one server blade 500 may be designated as the Active Manager utilizing server system management software) to communicate with the midplane 170 system management bus to monitor the midplane 170 and the modules (e.g., the server blades 110, media blades 150) connected thereto, to monitor on-board operating voltages and temperatures, and can be further configured to "trip" an alarm if thresholds are exceeded.

The server blade 500 illustrated in the example of FIG. 5 also includes a pair of network interfaces 506, 507. According to the embodiment of FIG. 5, dual Ethernet ports 506, 507 are provided. The Ethernet interfaces 506, 507 may utilize the Ethernet Express Pro 100 compatible, Intel 82559 Fast Ethernet Multifunction PCI Controller. The 82559 controller includes both the Media Access Controller (MAC) and the physical layer (PHY) interface combined into a single component solution. The network interfaces 506, 507 may be RJ-45 connectors on the faceplate of the server blade 500, and the faceplate may also include status LEDs 504 to indicate the status of each channel.

Semiconductor memory 510 is preferably utilized by the server blade 500 for local memory, such as a SDRAM dual-inline memory module (DIMM). Preferably, the SDRAM utilized is error correcting coded (ECC), which corrects single bit errors and reports multiple bit errors to the operating system. The server blade 500 may also provide on-board flash memory 512 for storing the system basic input/output system (BIOS), and for use as a solid-state disk. A battery-backable static random access memory (SRAM) may also be provided for this use as well.

The server blade 500 preferably includes interrupt controllers 526, such as 8259-style controllers, which provide support for level-triggered and edge-triggered inputs, individual input masking, and fixed and rotating priorities. A push-button reset/abort button 503 may also be provided to allow a user to reset the server blade 500. A keyboard/mouse connector 501 allows a user to connect a keyboard or mouse to the server blade 500 for interaction therewith. Optionally, a video output plug 505, such as a VGA connector, may be provided to allow connection to a monitor for video output. A universal serial bus (USB) 508 connector may also be provided to allow the server blade 500 to connect to other devices (e.g., portable optical disc drives, hard disk drives, etc.) as required.

The server blade 500 may include a serial port 502, such as a 16C550 PC-compatible serial port, on the front panel. A real-time clock 534 with battery power 532 is preferably provided on the server blade 500 to perform timekeeping functions, such as alarm, maskable periodic interrupt, and calendaring. A watchdog timer 528 may be optionally provided to monitor system operation and to be programmable for a number of timeout periods. Preferably, a two-stage watchdog timer is utilized, that is, it can be enabled to produce a non-maskable interrupt (NMI) before it generates a Reset Request. Therefore, failure to strobe the watchdog timer within the programmed time period may result in an NMI, a Reset Request, or both. A register is set if the watchdog timer caused the reset event. This watchdog timer is cleared only on power-up, enabling system software to take appropriate action on reboot. An input/output expansion connector 514 may be provided in the server blade 500 to allow expansion for interfacing with a storage medium, flash memory, etc.

Figure 6:
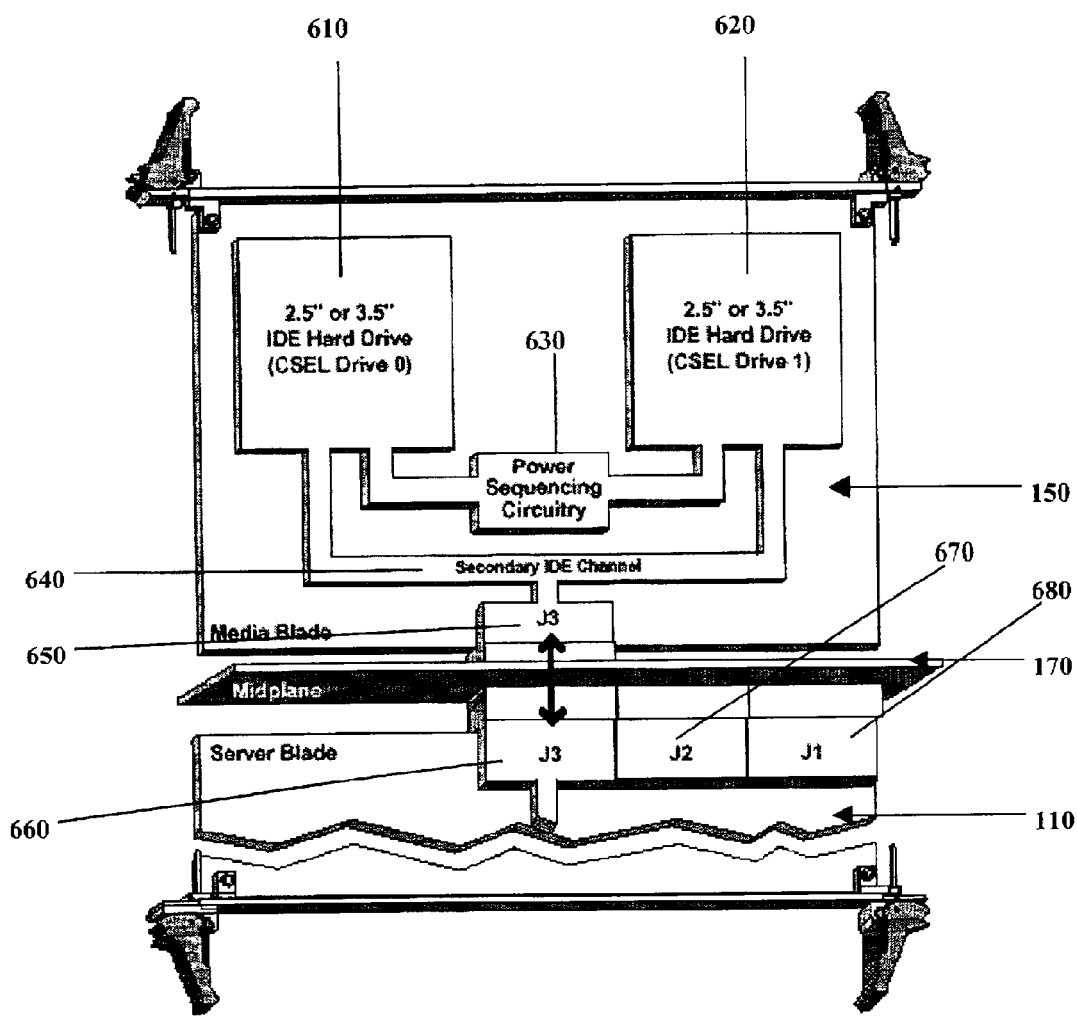
FIG. 6 illustrates a media blade having a connection with a server blade via a midplane according to an embodiment of the present invention.

FIG. 6 illustrates a media blade having a connection with a server blade via a midplane according to an embodiment of the present invention. The media blade 150 is a modular component of the modular server system 100, primarily adapted to carry a mass storage medium device such as a hard disk drive, as a companion to the server blade 110. However, the media blade 150 may also accommodate any other media devices, such as a graphics processing device, an audio processing device, a streaming media processing device, etc. In the embodiment illustrated in FIG. 6, the media blade 150 is adapted to support up to two 2.5 inch or 3.5 inch Integrated Drive Electronics (IDE) hard disk drives 610, 620. However, the media blade 150 may support any type or number of hard disk drives that are or may become available, of different interface types, and the media blade 150 may contain other processors and devices that provide Redundant Array of Independent Discs (RAID) functionality, and may interconnect with the PCI bus of the corresponding server blade 110.

Logically, the media blade 150 may lie on the server blade's 110 secondary IDE channel. The hard disk drives 610, 620 are preferably jumpered for Cable Select (CSEL), a feature that allows CSEL jumpered hard disk drives to automatically assume Drive 0/Drive 1 (Master/Slave) identities when cabled to the appropriate headers on the media blade 150. The Cable Select feature is built into the printed circuit board (PCB) and not the IDE cables (the cables are identical to one another and provide pin-to-pin contact at each lead).

According to an embodiment of the invention, the midplane input/output connector 650 of the media blade 150 is a CompactPCI form factor interface adapted for connection with a blade interface of the midplane 170. Similarly, the server blade 110 may include midplane connectors 660, 670, 680 that are CompactPCI form factor interfaces adapted for connection with a blade interface of the midplane 170. The midplane input/output connectors 640, 660 of the media blade 150 and server blade 110, respectively, preferably include the secondary IDE channel 640 for communication between the media blade 150 and the server blade 110 through the midplane 170, or may make use of the CompactPCI bus.

In the embodiment illustrated in FIG. 6, the media blade 150 includes power sequencing circuitry 630 that causes the hard disk drives 610, 620 to power up in sequence. This procedure avoids overloading the system with excessive current demands when the hard disk drives' 610, 620 spindle motors start up.

In summary, the modular server system 100 provides a compact, modular, efficient, and powerful multi-server system that is highly reliable and easy to maintain. The high density of the modular server system 100 reduces real estate costs, and the modular nature of its field replaceable units allows repairs and replacements to be performed quickly and easily.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein.

What is claimed is:

1. A modular server system, comprising:
   a midplane having a system management bus and a plurality of blade interfaces on the midplane, wherein the blade interfaces are in electrical communication with each other;
   a server blade inserted into one of the plurality of blade interfaces on the midplane, the server blade having a server blade system management bus in electrical communication with the system management bus of the midplane to monitor the midplane and one or more blades received and coupled to the blade interfaces on the midplane, and a network interface to connect to a network; and
   a media blade inserted into one of the plurality of blade interfaces on the midplane, the media blade having at least one media device.

2. The system according to claim 1, further including a power supply module inserted into the midplane to provide power to the modular server system.

3. The system according to claim 1, further including a cooling fan module coupled to the modular server system to cool the modular server system.

4. The system according to claim 1, further including at least one switch blade inserted into the midplane adapted to perform network switching.

5. The system according to claim 1, wherein the midplane is a CompactPCI form factor.

6. The system according to claim 1, further including a chassis to house the midplane, the server blade, and the media blade.

7. The system according to claim 1, wherein the server blade and the media blade are adapted to be hot swapped.

8. The system according to claim 1, wherein the server blade and the media blade in combination form an individual server system.

9. The system according to claim 1, wherein the network interface is an Ethernet connector jack.

10. The system according to claim 1, wherein the media device is selected from the group consisting of a storage medium device, a graphics processing device, an audio processing device, and a streaming media processing device.

11. The system according to claim 1, wherein to monitor comprises monitoring voltages and temperatures.

12. The system according to claim 11, wherein to monitor further comprises tripping an alarm if one of a voltage or a temperature threshold is exceeded.

13. A modular server system, comprising:
   a midplane having a system management bus, a first side, a second side, and a plurality of blade interfaces on the first side and the second side, wherein the blade interfaces on the first side are in electrical communication with the blade interfaces on the second side;
   a plurality of server blades each inserted into one of the plurality of blade interfaces on the first side of the midplane, the server blades each having a server blade system management bus in electrical communication with the system management bus of the midplane to monitor the the midplane and one or more blades received and coupled to the blade interfaces on the midplane, and a network interface to connect to a network;
   a plurality of media blades each inserted into one of the plurality of blade interfaces on the second side of the midplane, the media blades each having at least one storage medium device;
   a power supply module inserted into the midplane to provide power to the modular server system;
   a cooling fan module coupled to the modular server system to cool the modular server system; and
   a chassis to house the midplane, the server blades, the media blades, the power supply module, and the cooling fan module.

14. The system according to claim 13, further including least one switch blade inserted into the midplane adapted to perform network switching between any number of the server blades installed in the system.

15. The system according to claim 13, wherein the midplane is a CompactPCI form factor.

16. The system according to claim 13, wherein the storage medium device is a hard disk drive.

17. The system according to claim 13, wherein the server blades and the media blades are adapted to be hot swapped.

18. The system according to claim 13, wherein at least one of the server blades and at least one of the media blades in combination form an individual server system.

19. The system according to claim 13, wherein the network interface an Ethernet connector jack.

20. A modular server system, comprising:
   a midplane having a system management bus, a first side, a second side, and a plurality of blade interfaces on the first side and the second side, wherein the blade interface on the first side are in electrical communication with the blade interfaces on the second side;
   a server blade inserted into one of the plurality of blade interfaces on the first side of the midplane, the server blade having a server blade system management bus in electrical communication with the system management bus of the midplane to monitor the midplane and one or more blades received and coupled to the blade interfaces on the midplane, and a network interface to connect to a network;
   a media blade inserted into one of the plurality of blade interfaces on the second side of the midplane, the media blade having at least one storage medium device;
   a second server blade inserted into one of the plurality of blade interfaces on the first side of the midplane, the second server blade having a second server blade system management bus in electrical communication with the system management bus of the midplane, and a second network interface to connect to the network
   a second media blade inserted into one of the plurality of blade interfaces on the second side of the midplane, the second media blade having at least one second storage medium device;
   a power supply module inserted into the midplane to provide power to the modular server system;
   a cooling fan module coupled to the modular server system to cool the modular server system; and
   a chassis to house the midplane, the server blade, the media blade, the second server blade, the second media blade, the power supply module, and the cooling fan module, wherein the server blade, the media blade, the second server blade, and the second media blade share power from the power supply module and share cooling from the cooling fan module.

21. The system according to claim 20, further including at least two switch blades each inserted into the midplane adapted to perform network switching.

22. The system according to claim 20, wherein the midplane is a CompactPCI form factor.

23. The system according to claim 20, wherein the storage medium device and the second storage medium device are hard disk drives.

24. The system according to claim 20, wherein the server blade, the media blade, the second server blade, and the second media blade are adapted to be hot swapped.

25. The system according to claim 20, wherein the server blade and the media blade in combination form an individual server system.

26. The system according to claim 20, wherein the second server blade and the second media blade in combination form an individual server system.

27. The system according to claim 20, wherein die server blade, the second server blade, and the media blade in combination form two individual server systems.

28. The system according to claim 20, wherein the server blade, the media blade, and the second media blade in combination form an individual server system.

29. The system according to claim 20, wherein the network interface and the second network interface are Ethernet connector jacks.

30. The system according to claim 10, wherein the storage medium device is a hard disk drive.

31. A modular server system, comprising:

a midplane including a system management bus and a plurality of blade slots, wherein the blade slots receive and couple blades in communication with each other; and a slot from among the plurality of blade slots, the slot adapted to receive a server blade including a system management bus, and to couple the server blade system management bus in communication with the midplane system management bus to enable the server blade to monitor the midplane and one or more blades received and coupled to the blade slots on the midplane.

32. The system according to claim 31, wherein the plurality of blades slots are adapted to hot swap blades.

33. The system according to claim 31 further comprising:

another slot from among the plurality of blade slots to receive a media blade having at least one media device, wherein the other slot is adapted to couple in communication the media blade to a server blade to form an individual server system.

34. The system according to claim 31, wherein to monitor comprises monitoring voltages and temperatures.

35. The system according to claim 34, wherein to monitor further comprises tripping an alarm if one of a voltage or a temperature threshold is exceeded.

* * * * *

UNITED STATES PATENT AND TRADEMARK OFFICE
CERTIFICATE OF CORRECTION

PATENT NO.    : 6,950,895 B2                                    Page 1 of 1
DATED         : September 27, 2005
INVENTOR(S)   : Bottom It is certified that error appears in the above-identified patent and that said Letters Patent is hereby corrected as shown below:

Column 9,
Line 23, delete "die" and insert -- the --.

Signed and Sealed this

Thirteenth Day of December, 2005

JON W. DUDAS
*Director of the United States Patent and Trademark Office*